United States Patent
Redmayne et al.

(10) Patent No.: US 7,656,337 B2
(45) Date of Patent: Feb. 2, 2010

(54) METHOD AND SYSTEM FOR BIT POLARIZATION CODING

(75) Inventors: Derek Redmayne, Mountain View, CA (US); Richard James Reay, Mountain View, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 12/078,384

(22) Filed: Mar. 31, 2008

(65) Prior Publication Data
US 2009/0243905 A1    Oct. 1, 2009

(51) Int. Cl.
*H03M 1/10* (2006.01)
(52) U.S. Cl. .................................. 341/155; 341/55
(58) Field of Classification Search .............. 341/50, 341/55, 58, 59, 155
See application file for complete search history.

(56) References Cited

U.S. PATENT DOCUMENTS

| | | | |
|---|---|---|---|
| 4,531,153 A * | 7/1985 | Watanabe | 341/58 |
| 5,830,064 A | 11/1998 | Bradish et al. | |
| 6,229,897 B1 * | 5/2001 | Holthaus et al. | 380/270 |
| 6,346,895 B1 * | 2/2002 | Lee et al. | 341/58 |
| 7,061,408 B2 * | 6/2006 | Poechmueller | 341/55 |
| 7,501,963 B1 * | 3/2009 | Hollis | 341/55 |
| 2004/0108945 A1 | 6/2004 | Hori | |
| 2005/0047512 A1 * | 3/2005 | Neff et al. | 375/259 |

FOREIGN PATENT DOCUMENTS

| | | |
|---|---|---|
| EP | 0 845 779 A2 | 6/1998 |
| JP | 55 133158 A | 10/1980 |
| JP | 55133158 A * | 10/1980 |
| JP | 2002202760 A * | 7/2002 |

OTHER PUBLICATIONS

Youngsoo, Shin et al., Partial Bus-Invert Coding for Power Optimization of Application-Specific Systems, IEEE Transactions on Very Large Scale Integration (VLSI) Systems, vol. 9, No. 2, Apr. 2001 pp. 377-383.*

Stan et al., Bus-Invert Coding for Low-Power I/O, IEEE Transactions on Very Large Scale Integration (VLSI) Systems, vol. 3, No. 1, Mar. 1995 pp. 49-58.*

Translation of JP 55133158 A to Okada/NEC.*

European Search Report for Application No. 09157010.1, mailed Jul. 8, 2009.

* cited by examiner

*Primary Examiner*—Howard Williams
(74) *Attorney, Agent, or Firm*—McDermott Will & Emery LLP

(57) ABSTRACT

A method and system for converting a digital code. A digital signal is encoded to have a digital code having multiple binary bits. Substantially one half of the binary bits of the digital code is inverted to produce a modified digital code to reduce digital noise associated with the digital code.

14 Claims, 12 Drawing Sheets

160

| Analog Input | Digital Output |
|---|---|
| > 1.000000V | 01 1111 1111 1111 |
| + 0.999878V | 01 1111 1111 1111 |
| + 0.999756V | 01 1111 1111 1110 |
| + 0.000244V | 00 0000 0000 0010 |
| + 0.000122V | 00 0000 0000 0001 |
| + 0.000000V | 00 0000 0000 0000 |
| - 0.000122V | 11 1111 1111 1111 |
| - 0.000244V | 11 1111 1111 1110 |
| - 0.999878V | 10 0000 0000 0001 |
| - 1.000000V | 10 0000 0000 0000 |
| < - 1.000000V | 10 0000 0000 0000 |

190 — Analog Input
195 — Digital Output

Fig.1(d) (Prior Art)

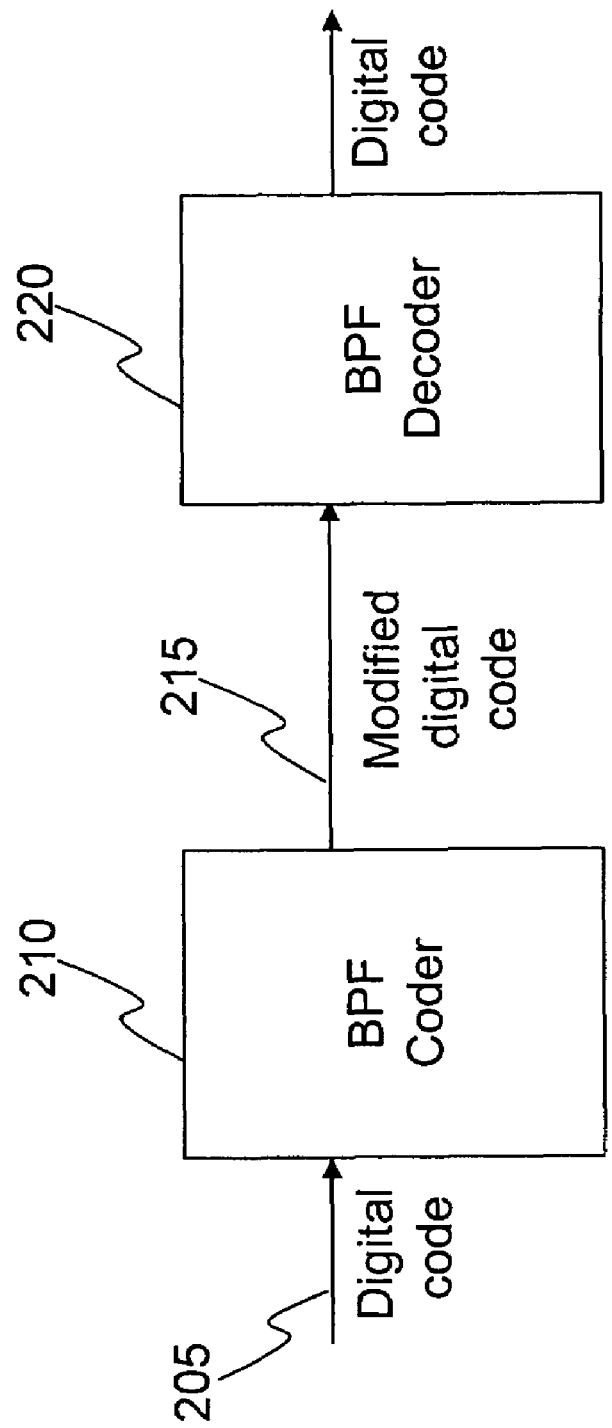

| Analog Input | Digital Code | Modified Digital Code |
|---|---|---|
| > 1.000000V | 01 1111 1111 1111 | 11 0101 0101 0101 |
| + 0.999878V | 01 1111 1111 1111 | |
| + 0.999756V | 01 1111 1111 1110 | 11 0101 0101 0110 |
| + 0.000244V | 00 0000 0000 0010 | 10 1010 1010 1000 |
| + 0.000122V | 00 0000 0000 0001 | 10 1010 1010 1011 |
| + 0.000000V | 00 0000 0000 0000 | 10 1010 1010 1010 |
| − 0.000122V | 11 1111 1111 1111 | 01 0101 0101 0101 |
| − 0.000244V | 11 1111 1111 1110 | 01 0101 0101 0100 |
| − 0.999878V | 10 0000 0000 0001 | 00 1010 1010 1011 |
| − 1.000000V | 10 0000 0000 0000 | 00 1010 1010 1010 |
| < − 1.000000V | 10 0000 0000 0000 | 00 1010 1010 1010 |

METHOD AND SYSTEM FOR BIT POLARIZATION CODING

BACKGROUND

1. Field of Invention

The teachings presented herein relate to electronic circuitry. More specifically, the teachings relate to methods and systems for digital data coding and electronic circuits incorporating the same.

2. Discussion of Related Art

A/D and D/A converters are widely used in the industry of electronics. In converting an analog signal to a digital signal, the analog signal is sampled at discrete points according to a certain frequency. Voltages of the analog signal at such sampled points are measured. Each measured voltage at a sampling point is then coded using a digital code having a plurality of binary bits. Such a digital code can be used to represent the sampled analog value and can be transmitted in a digital means to a destination. Once the digital code representing an analog value is received by a receiver, the digital code can be decoded by a D/A converter to derive an estimated voltage that is similar to the original voltage being coded. FIG. 1(a) shows a typical A/D and D/A processing flow. In FIG. 1(a), an A/D converter 110 takes an analog signal A as input and generates a digital code B as an output. The digital code B is often processed by a digital signal processor 115 to generate a digital signal C. When digital signal C is transmitted and received by a receiver 120, which may then apply a D/A process at a D/A converter 130 and produces a recovered analog signal C' based on digital signal C.

A digital code representing a particular sampled voltage of the analog signal is conventionally determined, by the A/D converter 110 based on a look-up table in accordance with the voltage level of the sample. For example, FIG. 1(b)(Prior Art) depicts a typical A/D converter 110. An analog signal A is sampled first by an analog sampling unit 140 to produce individual analog voltages as an output. For each such analog voltage, an A/D look-up unit 150 determines a digital code representing the analog voltage based on a look-up table 160.

A D/A converter reverses the process to convert a digital code to generate an analog voltage represented by the digital code. This is shown in FIG. 1(c) (Prior Art), where a D/A look-up unit 170 in a D/A converter 130 consults with the look-up table 160 based on a received digital code C to produce an analog voltage. The represented analog voltage is then sent to an analog signal generator 180, which may utilize different analog voltages to produce an estimated analog signal C'.

FIG. 1(d) (Prior Art) shows an exemplary look-up table 160 in which the left column 190 lists various ranges of analog voltages and, correspondingly, the right column 195 provides 14-bit digital codes for different voltage ranges. For instance, for a zero voltage, the digital code is "00 0000 0000 0000". For a voltage between +0.000122 v and +0.000244 v, the corresponding digital code is "00 0000 0000 0001". For a voltage between −0.000122 v and −0.000244, the corresponding digital code is "11 1111 1111 1111", etc.

In accordance with the conventional look-up table, as shown in FIG. 1(d) (Prior Art), when an analog signal crosses 0V in a negative direction, all the binary bits of the digital code change state from 0 to 1. When a large number of digital outputs change at the same time in the same direction (from 1's to 0's or from 0's to 1s), noise current on the circuit board is induced because the output load capacitances are charged and discharged. In various applications such as communications, it is common to have an analog signal centered at 0 v and such an analog signal may also have frequent deviations from 0V. Consequently, all binary bits of a digital code will frequently change states which make the problem worse.

A previous solution for reducing digital noise is Gray Coding, as disclosed in U.S. Pat. No. 2,632,058 issued to F. Gray. This method solves the problem by allowing only one bit changing state between any two adjacent codes. Although such a solution solves the problem, a disadvantage of this approach is that its implementation requires complex circuitry for coding and decoding data. Therefore, a solution that both reduces digital noise and is cost effective is needed.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 1(a)-(d) (Prior Art) illustrate a conventional A/D and D/A flow and how analog information is digitally coded and decoded;

FIG. 2 depicts a high level block diagram for bit polarization format coding, according to an embodiment of the present teaching;

FIG. 3 shows a conversion table facilitating transformations from an analog voltage to a digital code and from a digital code to a modified digital code using bit polarization format, according to an embodiment of the present teaching;

DETAILED DESCRIPTION

Figure 1A:
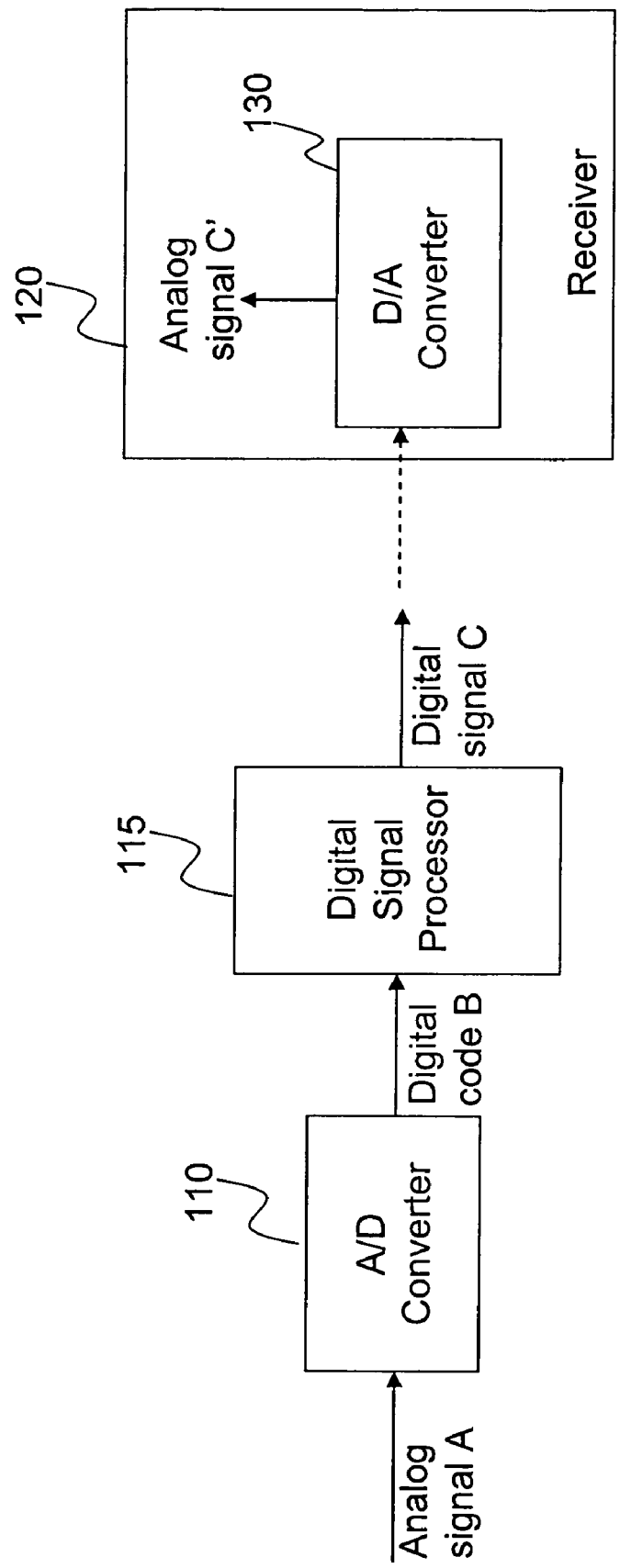

The present teaching discloses methods and systems for realizing bit polarization format and application thereof. FIG. 2 depicts a high level block diagram 200 for bit polarization format coding, according to an embodiment of the present teaching. A digital code 205 is a binary code having a plurality of binary bits. For example, a digital code can have 14 binary bits, each of which has a state of either 0 or 1. Such a binary code may be an output from an A/D converter (not shown). According to the present teaching, when a digital code 205 is received, it is modified by a bit polarization format (BPF) unit 210 to produce a modified digital code 215. Compared with the digital code 205, the modified digital code 215 is derived by inverting a certain portion of the bit state of the digital code 205. For example, substantially one half of the bits in the digital code 205 may be inverted. When the present teaching is deployed in connection with an A/D converter, employment of the bit polarization format is for the purpose of balancing the number of bits that change from 0s to is and the number of bits that change from 1s to 0s, especially when the analog signal is a small signal.

On the receiver side (not shown), when the modified digital code 215 is received, a BPF decoder 220 performs a reverse operation to recover the digital code 205 based on the modified digital code 215. When the BPF coder 210 inverts a certain number of bits, the BPF decoder 220 applies inversion to the same bits that have been inverted by the BPF coder 210.

An exemplary BPF coding scheme is to alternate the bits to be inverted, namely alternate bit polarization format or ABPF. This ensures that one half of the bits are inverted when the total number of bits is an even number and a substantially one half of the total number of bits are inverted when the number of bits is an odd number. FIG. 3 illustrates an ABPF conversion table for the BPF coder 210 and BPF decoder 220.

In FIG. 3, a conversion table facilitates transformations from an analog voltage to a digital code and from a digital code to a modified digital code using bit polarization format, according to an embodiment of the present teaching. The left column 190 and the middle column 195 correspond to the left column 190 and right column 195 in FIG. 1(d). The right column 310 in FIG. 3 corresponds to the BPF coding. For each digital code in the table (one row), the modified digital code can be derived by inverting every other bit in the given digital code. For instance, for a digital code with all zeros corresponding to analog voltage 0V, the modified digital code is "10 1010 1010 1010". Similarly, for digital code "11 1111 1111 1111" corresponding to a small deviation from 0V, i.e., −0.000122V, the modified digital code is "01 0101 0101 0101". As can be seen, from 0V to −0.000122V, the digital codes change from all zeros to all ones, which has the problem discussed herein. With the modified digital codes, about one half of such changes are avoided and, hence, to reduce the digital noise associated with the original digital code.

Figure 1B:
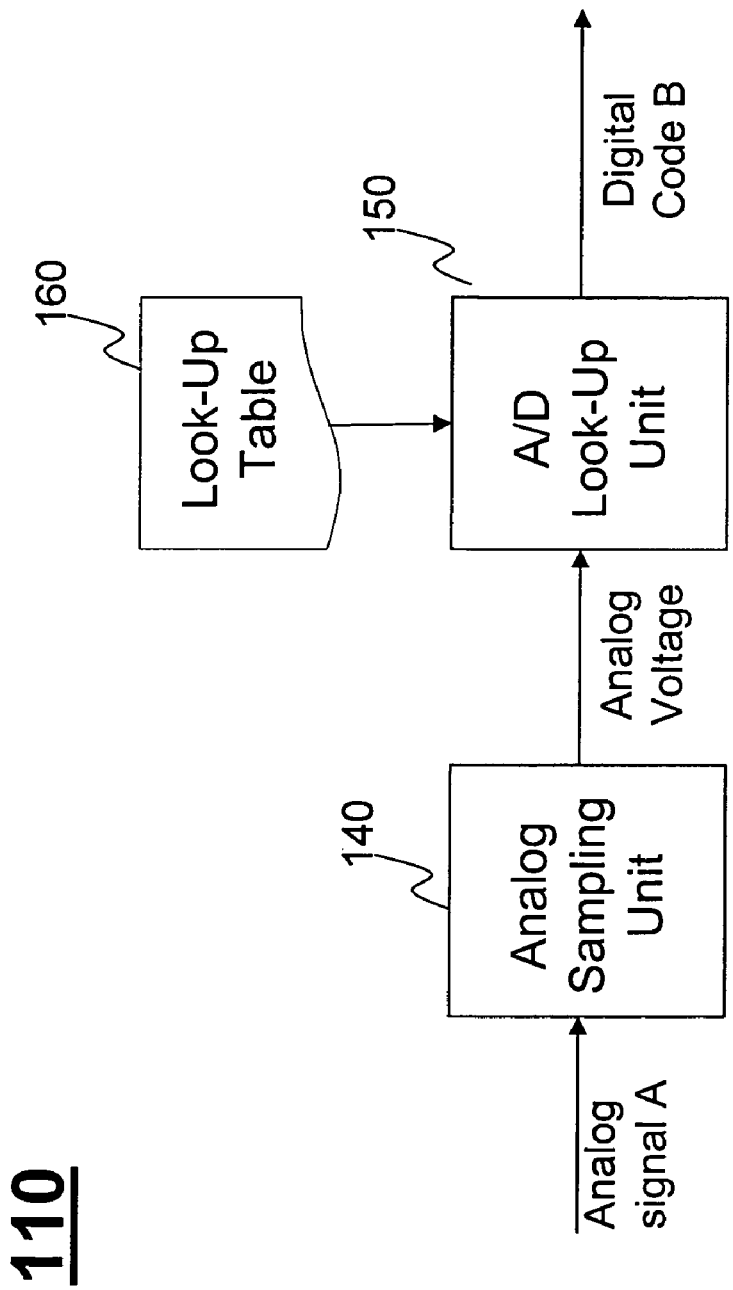
Figure 1C:
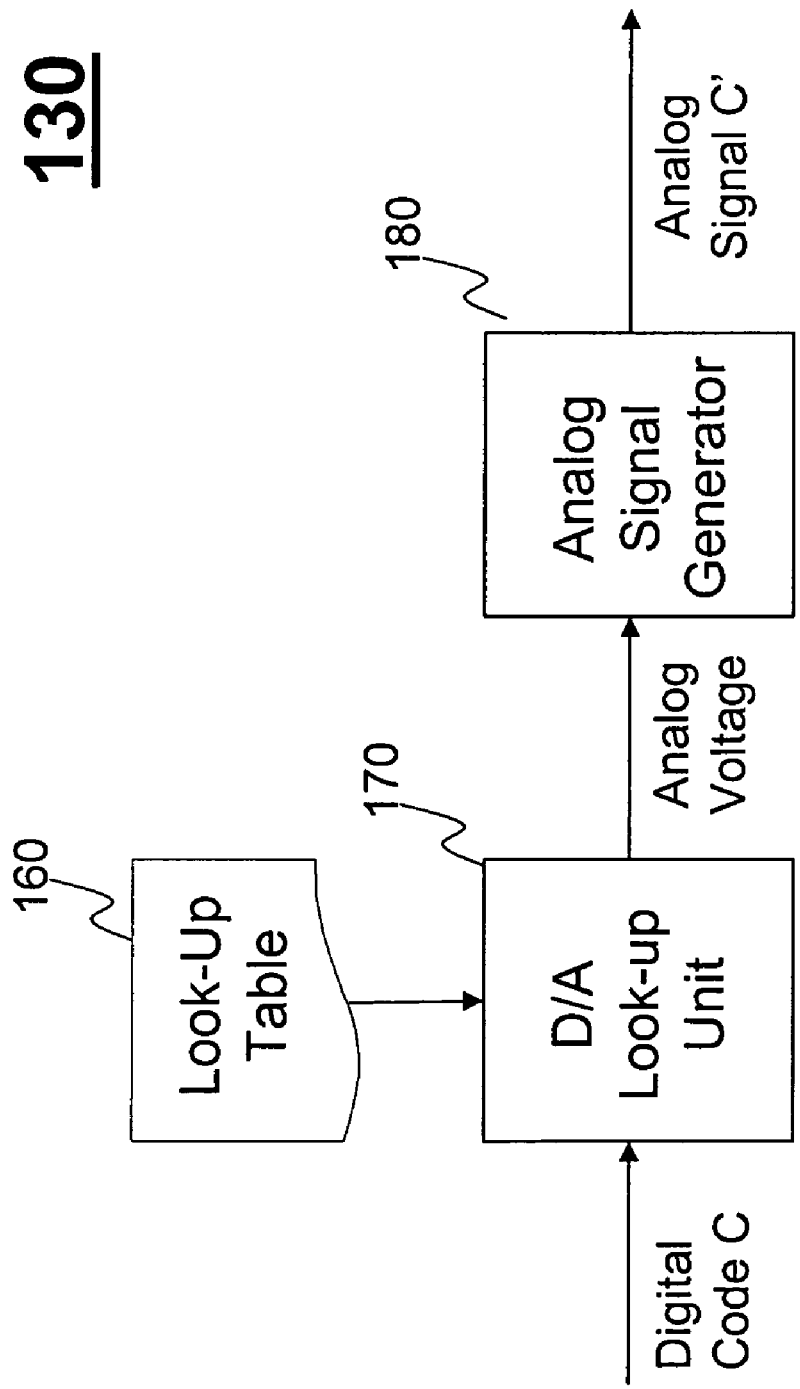
Figure 4:
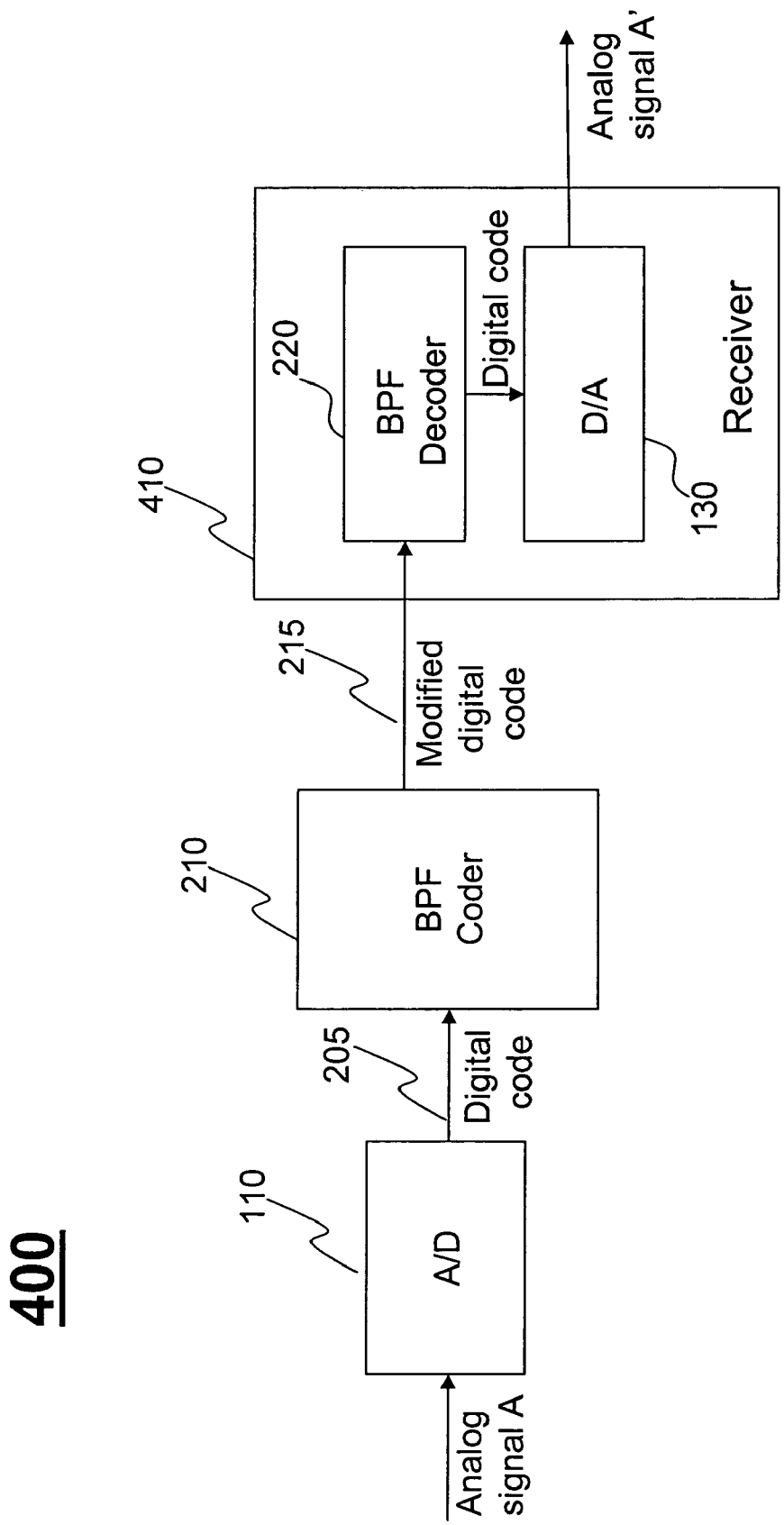
FIG. 4 depicts a block diagram 400 incorporating BPF coding in the context of A/D and D/A flow, according to an embodiment of the present teaching.

FIG. 4 depicts a block diagram 400 incorporating BPF coding in the context of A/D and D/A flow, according to an embodiment of the present teaching. The block diagram structure illustrated in FIG. 4 is largely similar to what is shown in FIG. 1 except for the incorporation of the BPF coder 210 and the BPF decoder 220. In this depicted embodiment, a digital code generated by the A/D converter 110 is modified by the BPF coder 210 to generate a modified digital code according to a pre-determined coding scheme. Such a pre-determined scheme may correspond to what is illustrated in FIG. 3 or can be any coding scheme (some are shown in FIG. 5(a)-(e)) that is appropriate.

A receiver 410 in FIG. 4 decodes first, upon receiving the modified digital code, to recover the digital code that has been modified. Such produced digital code is then sent to the D/A converter to produce an estimate A' for the original analog voltage A.

Figure 5A:
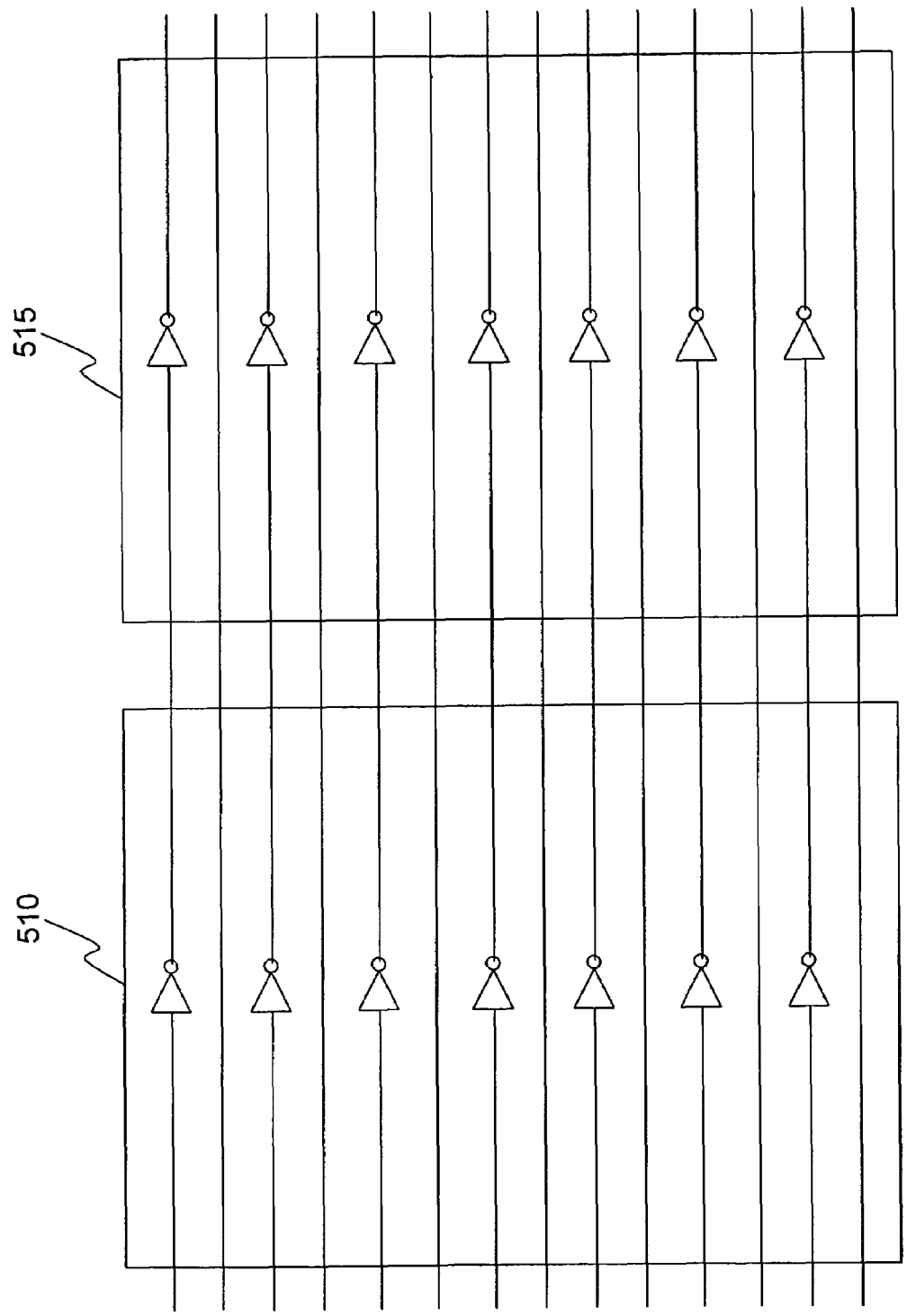
FIG. 5(a)-(e) show different exemplary implementations of bit polarization coding according to embodiments of the present teaching.

FIG. 5(a)-(e) show different exemplary bit polarization formats according to embodiments of the present teaching. FIG. 5(a) shows an exemplary scheme in which alternate bits are inverted to achieve bit polarization, according to an embodiment of the present teaching. In FIG. 5(a), the left circuitry 510 represents an exemplary implementation of a BPF coder, having inverters arranged in alternate to achieve alternate bit inversion. The outputs of the circuit 510 collectively represent the modified digital code. The right circuitry 515 represents an exemplary implementation of a BPF decoder, having inverters arranged in the same configuration as in the BPF coder 510 to recover the original digital code. The outputs of the circuitry 515 collectively represent the decoded digital code.

Figure 5B:
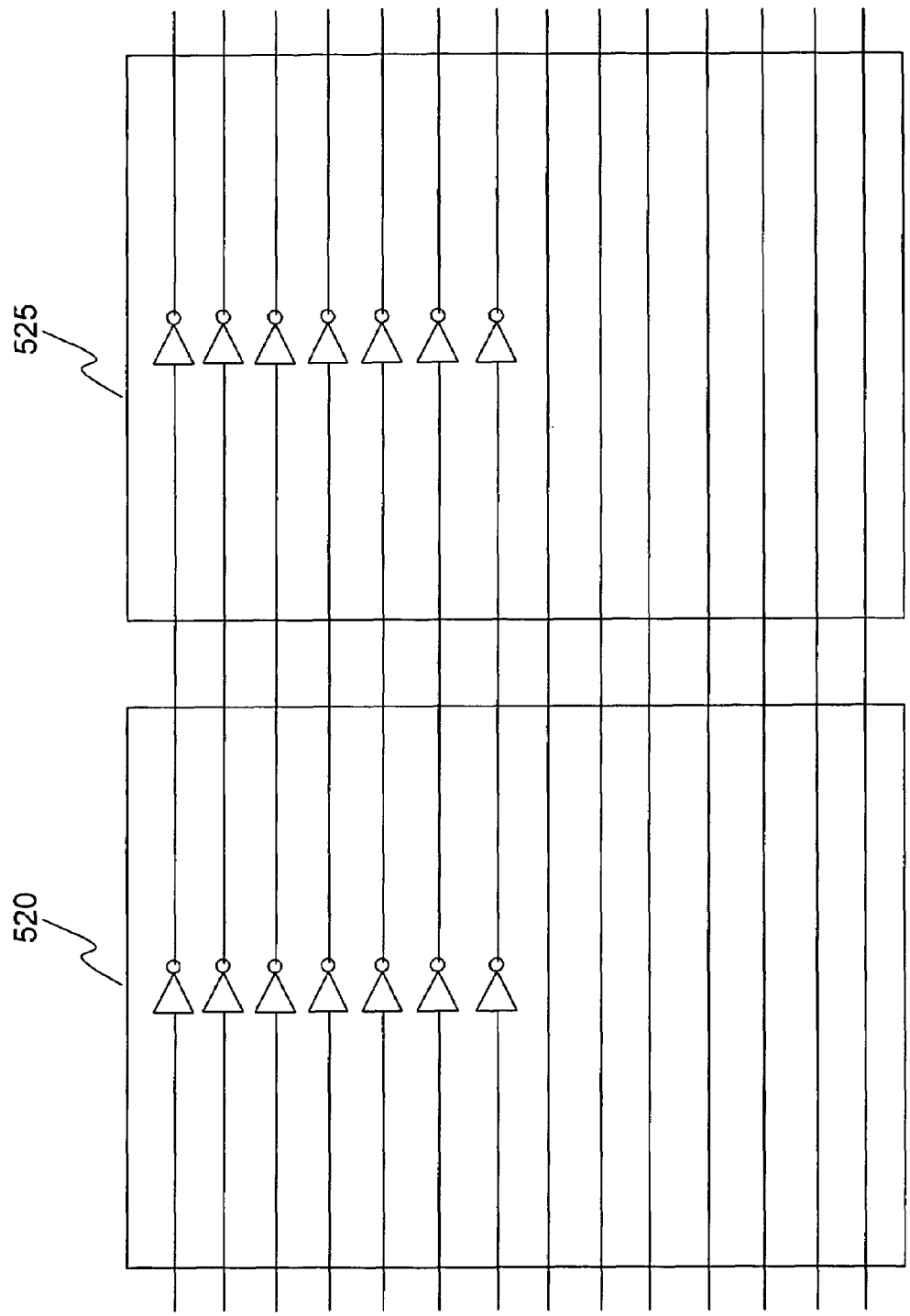

FIG. 5(b) shows a different exemplary scheme in which about one half of the bits are inverted to achieve bit polarization, according to an embodiment of the present teaching. In FIG. 5(b), the left circuitry 520 represents an exemplary implementation of a BPF coder, having inverters arranged in the top end portion of the circuitry to invert the first one half of the bits. Such first one half may correspond to the least significant bits or most significant bits of a digital code. The right circuitry 525 represents an exemplary implementation of a BPF decoder, having inverters arranged in the same configuration as in the BPF coder 520 to recover the original digital code.

Figure 5C:
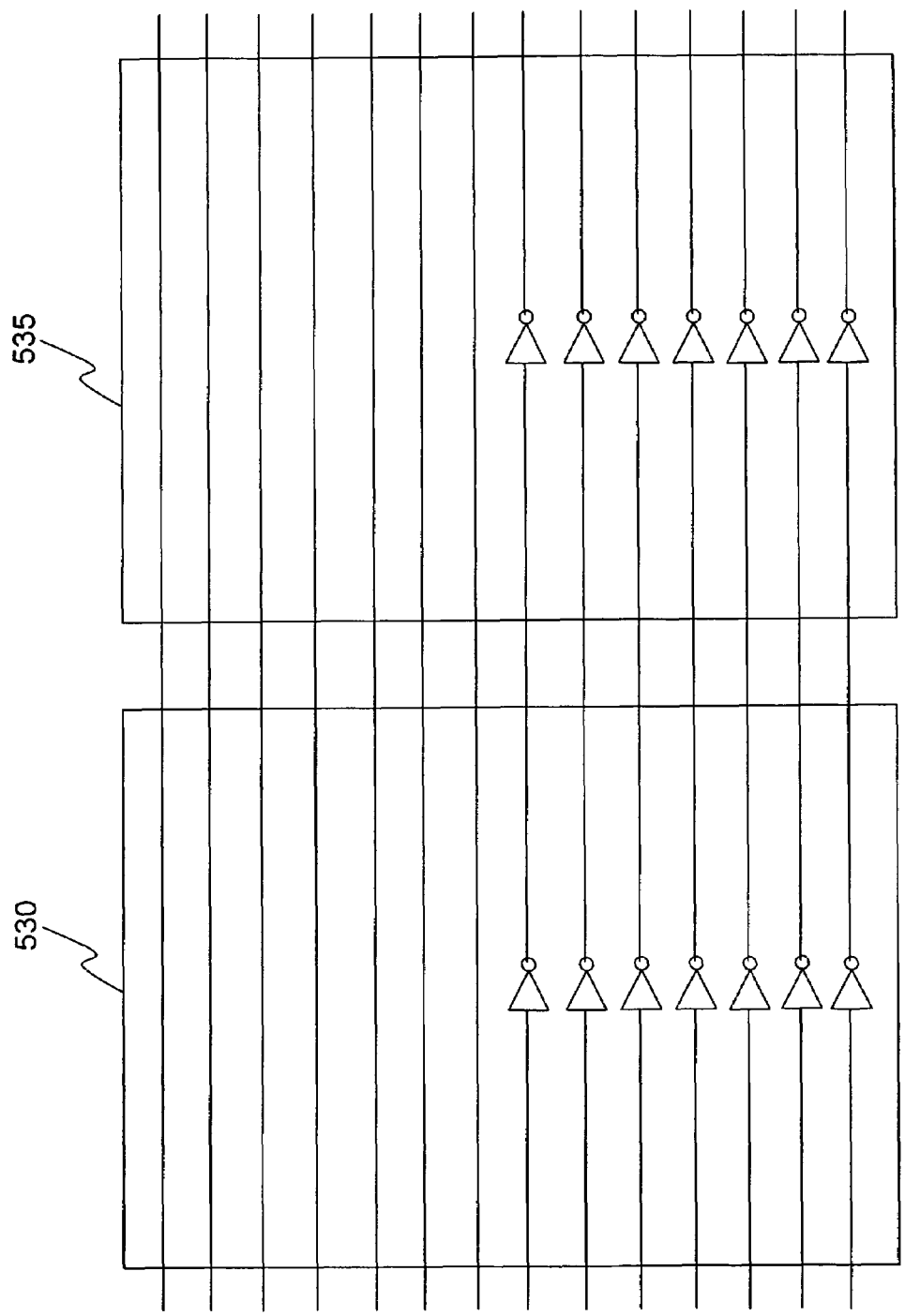

FIG. 5(c) shows another different exemplary scheme in which about one half of the bits are inverted to achieve bit polarization, according to an embodiment of the present teaching. In FIG. 5(c), the left circuitry 530 represents an exemplary implementation of a BPF coder, having inverters arranged in bottom end portion of the circuitry to invert the bottom one half of the bits. Such bottom one half may correspond to the most significant bits or least significant bits of a digital code. The right circuitry 535 represents an exemplary implementation of a BPF decoder, having inverters arranged in the same configuration as in the BPF coder 530 to recover the original digital code.

Figure 5D:
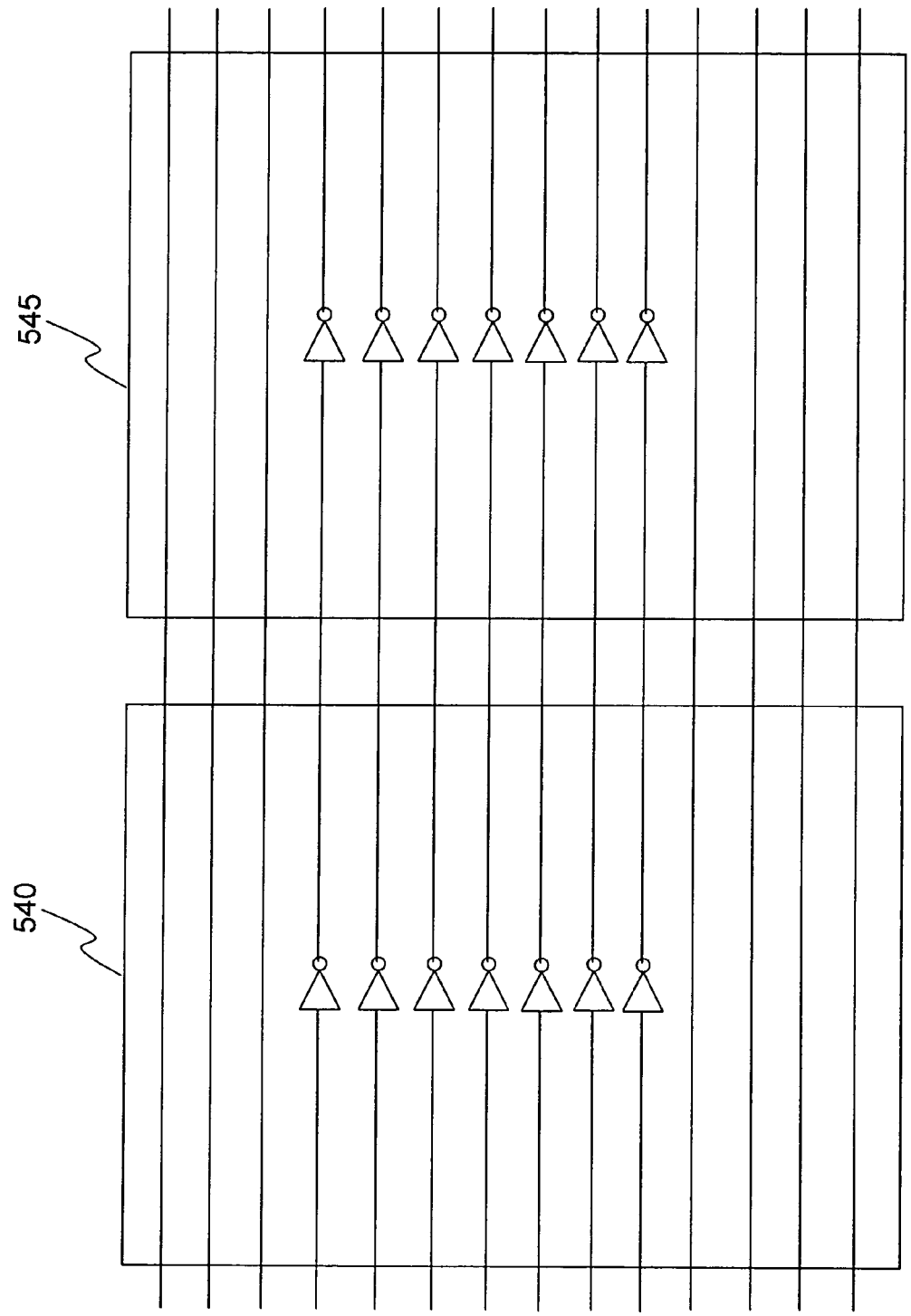

FIG. 5(d) shows yet another different exemplary scheme in which about one half of the bits are inverted to achieve bit polarization, according to an embodiment of the present teaching. In FIG. 5(d), the left circuitry 540 represents an exemplary implementation of a BPF coder, having inverters corresponding to about one half of the total number of bits of a digital code and arranged in a consecutive manner in any middle portion of the of the circuitry to invert corresponding one half of the bits. By middle portion, it can be anywhere as long as it does not include the least and most significant bits. The right circuitry 545 represents an exemplary implementation of a BPF decoder, having inverters arranged in the same configuration as in the BPF coder 540 to recover the original digital code.

Figure 5E:
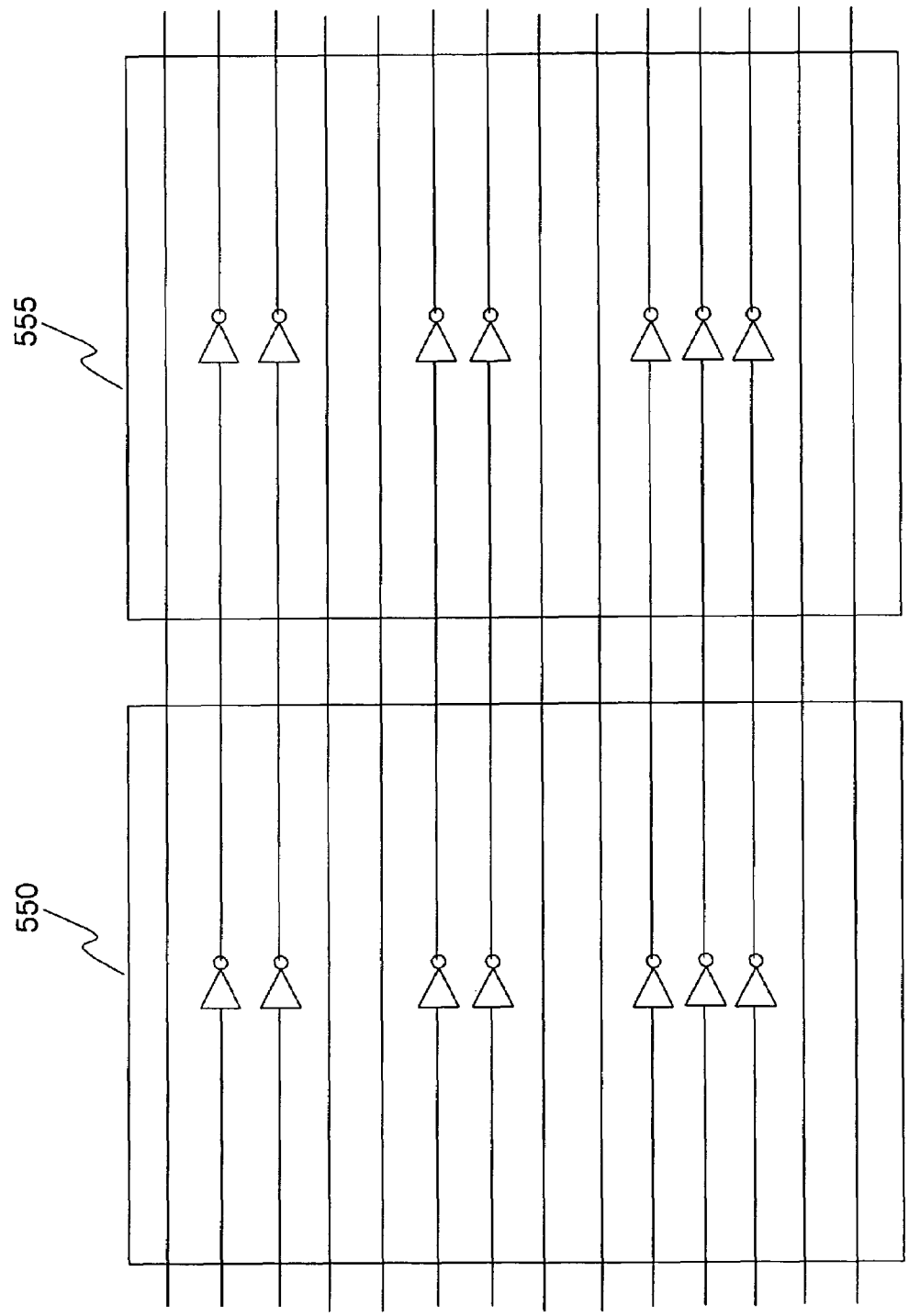

FIG. 5(e) shows another different exemplary scheme in which about one half of the bits are inverted to achieve bit polarization, according to an embodiment of the present teaching. In FIG. 5(e), the left circuitry 550 represents an exemplary implementation of a BPF coder, having inverters corresponding to about one half of the total number of bits of a digital code and arranged in a plurality of clusters, each may have a different number of inverters and scattered in non-adjacent portions of the circuitry to invert corresponding one half of the bits. The right circuitry 555 represents an exemplary implementation of a BPF decoder, having inverters arranged in the same configuration as in the BPF coder 550 to recover the original digital code.

All embodiments disclosed have simple and cost effective implementations, yet can achieve the goal of avoiding having all bits changing states at the same time and, hence, reduce the digital noise.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

We claim:

1. A method for converting an analog signal to a digital signal, comprising:
   receiving an analog signal;
   measuring a voltage of the analog signal with respect to a sampling point;
   selecting, based on the voltage measured, a digital code comprising a plurality of binary bits;

inverting substantially one half of the plurality of binary bits of the digital code without consideration of the state of the binary bits to produce a modified digital code to represent the analog signal at the sampling point.

2. The method of claim 1, wherein the one half of the plurality of binary bits comprises alternate bits of the binary bits.

3. The method of claim 1, wherein the one half of the plurality of binary bits comprises a first half of the binary bits.

4. The method of claim 1, wherein the one half of the plurality of binary bits comprises a second half of the binary bits.

5. The method of claim 1, where the one half of the plurality of binary bits corresponds to consecutive binary bits.

6. A method for converting a digital signal to an analog signal, comprising:
   receiving a digital signal encoded to have a digital code comprising a plurality of binary bits;
   inverting substantially one half of the plurality of binary bits without consideration of the state of the binary bits to produced a modified digital code;
   determining a voltage of the analog signal at a sampling point represented by the modified digital code.

7. The method of claim 6, wherein the one half of the plurality of binary bits comprises alternate bits of the binary bits.

8. The method of claim 6, wherein the one half of the plurality of binary bits comprises a first half of the binary bits.

9. The method of claim 6, wherein the one half of the plurality of binary bits comprises a second half of the binary bits.

10. The method of claim 6, where the one half of the plurality of binary bits corresponds to consecutive binary bits.

11. An electronic circuit including an A/D converter, comprising:
    a circuit, configured for carrying out a function and having a portion thereof capable of converting an analog signal to a digital signal, wherein the portion converting an analog signal to a digital signal comprises:
    a receiving portion capable of receiving an analog signal;
    a measuring portion capable of determining a voltage of the analog signal with respect to a sampling point;
    a conversion portion capable of selecting, based on the voltage of the analog signal, a digital code comprising a plurality of binary bits;
    an inversion portion capable of inverting substantially one half of the plurality of binary bits of the digital code to produced a modified digital code to digitally represent the analog signal at the sampling point without consideration of the state of the binary bits.

12. An electronic circuit including a D/A converter, comprising:
    a circuit, configured for carrying out a function and having a portion thereof capable of converting a digital signal to an analog signal, wherein the portion converting a digital signal to an analog signal comprises:
    a portion capable of receiving a digital code comprising a plurality of binary bits;
    an inversion portion capable of inverting substantially one half of the plurality of binary bits to produced a modified digital code that represents the analog signal at a sample point without consideration of the state of the binary bits;
    a conversion portion capable of determining a voltage of the analog signal at the sampling point represented by the modified digital code.

13. A method for reducing digital noise, comprising:
    receiving a digital signal encoded to have a digital code comprising a plurality of binary bits;
    inverting substantially one half of the plurality of binary bits of the digital code without consideration of the state of the binary bits to produce a modified digital code to reduce digital noise associated with the digital code.

14. A method for reducing digital noise, comprising:
    receiving a digital signal encoded to reduce digital noise associated with a corresponding digital code, wherein the digital signal includes a plurality of binary bits;
    inverting substantially one half of the plurality of binary bits of the digital signal without consideration of the state of the binary bits to recover the corresponding digital code.

* * * * *